(12) United States Patent
Hashimoto et al.

(10) Patent No.: US 7,535,243 B2
(45) Date of Patent: May 19, 2009

(54) METHOD AND PROGRAM FOR CONTROLLING AN APPARATUS FOR MEASUREMENT OF CHARACTERISTICS OF A SEMICONDUCTOR DEVICE UNDER TEST

(75) Inventors: Yasushi Hashimoto, Tokyo (JP); Takayuki Takao, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 270 days.

(21) Appl. No.: 11/483,810

(22) Filed: Jul. 10, 2006

(65) Prior Publication Data

US 2007/0018636 A1    Jan. 25, 2007

(30) Foreign Application Priority Data

Jul. 19, 2005    (JP)    ............................. 2005-208467

(51) Int. Cl.
*G01R 31/26*    (2006.01)
(52) U.S. Cl. ...................................... 324/765
(58) Field of Classification Search ........................ None
See application file for complete search history.

(56) References Cited

U.S. PATENT DOCUMENTS

| | | | | |
|---|---|---|---|---|
| 6,069,484 A | * | 5/2000 | Sobolewski et al. | .......... 324/765 |
| 7,068,060 B2 | * | 6/2006 | Iwasaki | ....................... 324/765 |
| 7,262,626 B2 | * | 8/2007 | Iwasaki | ....................... 324/765 |
| 2005/0225316 A1 | | 10/2005 | Iwasaki | .................... 324/158.1 |
| 2005/0237079 A1 | * | 10/2005 | Tanida et al. | ................. 324/765 |

* cited by examiner

*Primary Examiner*—Vinh P Nguyen
(74) *Attorney, Agent, or Firm*—Marc Bobys

(57) ABSTRACT

When first and second measuring equipment connected to switches are switched to measure multiple types of electronic characteristics of a device under test which is a semiconductor device, the device under test is disconnected from the second measuring equipment and is connected to the first measuring equipment. Thereafter, the first measuring equipment applies a voltage to the device under test via the switches so that the voltage of the first measuring equipment matches the output voltage of the second measuring equipment. The device under test is then disconnected from the first measuring equipment and is connected to the second measuring equipment for measurement.

4 Claims, 5 Drawing Sheets

METHOD AND PROGRAM FOR CONTROLLING AN APPARATUS FOR MEASUREMENT OF CHARACTERISTICS OF A SEMICONDUCTOR DEVICE UNDER TEST

BACKGROUND OF THE INVENTION

The present invention relates to a method for controlling an apparatus for measurement of characteristics of a semiconductor device under test. More specifically, the present invention relates to a method for controlling electronic characteristic measurement apparatuses that change connections thereof to measure electronic characteristics of integrated circuit devices or discrete electronic circuit devices.

There is an apparatus which measures electronic characteristics of devices to be tested (hereinafter referred to as "devices under test" (DUTs)), such as discrete electronic circuit devices or integrated circuit devices including semiconductors or the like. With such an apparatus, multiple measurements are performed on one DUT. For example, the measurement is performed by switching among a combination of capacitance measurement for layer-thickness evaluation and gate leakage current measurement for the MOS (metal oxide semiconductor) gate oxide layer, a combination of the evaluation of line capacitance and line-to-line leakage, and a combination of the evaluation of junction capacitance and IV (current-voltage) characteristics for bipolar transistor.

FIG. 1 shows a known example of equipment for measuring electronic characteristics, such as current-voltage characteristics, by using a probe apparatus 100 to probe a DUT 10. The apparatus 22 capable of measuring electrical capacitance (which apparatus will hereinafter be referred to as a "CMU" (capacitance measure unit)) is connected to the DUT 10 to be used. In this known example, one or more apparatuses in which a DC (direct current) voltage source, a current source, a voltmeter, and an ammeter are integrated in such a manner that they can be used in an arbitrary combination are connected to the DUT 10. Such apparatuses are called source monitor units or source measurement units (hereinafter referred to as "SMUs") and can be used independently or in combination. In the example shown in FIG. 1, an SMU 20 (including SMUs 201 and 202) and the CMU 22, which are mounted in an equipment rack 200, are used to perform measurement. For measurement using the SMU 20 and the CMU 22, an SCUU (SMU CMU Unity Unit) may be used to connect the probe apparatus 100 for probing the DUT 10 and the SMU 20 and the CMU 22 and also to switch between the SMU 20 and the CMU 22.

With such an SCUU, when the DUT 10 and the CMU 22 are interconnected and measurement is performed using the CMU 22, dielectric absorption occurs at terminals between switches (switching means) in the SCUU. When the DUT 10 and the SMU 20 are interconnected, micro current is generated in the SCUU. Consequently, some waiting time may be required for the measurement. For example, in order for the SMU 20 to perform high-accuracy measurement at 1 fA (femtoampere) or less after the CMU 22 performs measurement with a voltage of about 100 V, it may be necessary to have a waiting time of about 60 seconds. In such a case, even if the SCUU quickly switches between the SMU 20 and the CMU 22, measurement cannot be performed promptly.

SUMMARY OF THE INVENTION

Accordingly, an object of the present invention is to overcome at least some of the foregoing problems. The present invention provides a control method that switches between first and second measuring means connected to switching means in order to measure multiple types of electronic characteristics of a device under test (DUT) which is a semiconductor device. The control method comprises the steps of: (a) causing the switching means to electrically disconnect the DUT from the second measuring means and electrically connect the DUT to the first measuring means; and (b) causing the first measuring means to apply a voltage to the DUT via the switching means for measuring a first electronic characteristic of the DUT and maintaining an output voltage of the second measuring means to match an output voltage of the first measuring means. The control method further comprises the steps of: (c) causing the switching means to electrically disconnect the DUT from the first measuring means and electrically connect the DUT to the second measuring means; and (d) causing the second measuring means to measure a second electronic characteristic of the DUT.

This control method solves the problems described above. That is, according to the present invention, after measurement is performed with a DUT and the first measuring means (a CMU) being interconnected, for example, even when the switching means provided in the SCUU is operated to connect the DUT and the second measuring means (an SMU), the switching means does not generate current. This is because, according to the present invention, the output voltage of the SMU and the output voltage of the CMU are made to match each other to thereby make it possible to prevent the generation of the dielectric absorption. The term "dielectric absorption" refers to a phenomenon that occurs in a dielectric element, such as a capacitor, to some degree and that is typically observed as a direct current (DC) that gradually decreases after a constant voltage is applied to the dielectric element. The phenomenon is caused by positive and negative electrical charges that break away and then gather at a certain spot in the dielectric element. According to findings of the present inventors, in the present invention, the output voltage of each measuring means is controlled to prevent the occurrence of dielectric absorption. Specifically, the output voltage of the second measuring means is made to match the output voltage of the first measuring means, which performs measurement. Matching the output voltages of both measuring means refers to performing control so that a difference in the output voltages becomes small compared to a case in which no intentional control is performed. Typically, control is performed so that the voltage difference approaches 0 V. Terminals of the switching means refer to, of conductors provided at the switching means, any terminals that can establish connection with external wiring lines (including traces).

In the present invention, preferably, the switching means comprises: a first switch that is connected to the DUT to electrically connect or disconnect the DUT with the first measuring means; a second switch that is connected to the DUT to electrically connect or disconnect the DUT with the second measuring means; and a guard pipe that covers a switching portion of the second switch and that is connected to a guard output of the second measuring means. The use of the switch having the guard pipe connected to the guard output can eliminate measurement error factors, such as dielectric absorption, leakage current, and electromagnetic noise at the switching portions of the switch, and can achieve high-accuracy measurement.

In the present invention, preferably, in step (b), a direct-current component of the output voltage of the first measuring means and a direct-current component of the output voltage of the second measuring means are made substantially equal to each other.

The DC components include a DC bias applied to the DUT. As one example, when AC (alternating current) components are measured while the first measuring means applies a DC bias, the output voltage of the second measuring means is made to match the DC bias. In order to reduce the dielectric absorption, a reduction in potential difference of DC components is effective. Thus, the DC components of the output voltages of both the measuring means are made substantially equal to each other, preferably with an accuracy on the order of several tens of millivolts to several millivolts.

Preferably, the first measuring means comprises an electrical-capacitance measurement device, and the second measuring means comprises a current-voltage characteristic measurement device.

The electrical-capacitance measurement device is, for example, an LCR (inductance-capacitance-resistance) meter, or an Impedance meter. The current-voltage characteristic measurement device is, for example, a source monitor unit (SMU). The electrical-capacitance measurement device measures mainly properties of a DUT in AC and the current-voltage characteristic measurement device measures mainly properties of the DUT in DC.

The electrical-capacitance measurement device may perform measurement by a relatively high voltage. Thereafter, when the current-voltage characteristic measurement device performs measurement, the dielectric absorption particularly becomes a problem. Accordingly, it is advantageous to use the control method described above to switch between measurement devices.

The present invention can also be realized by a computer program. That is, the present invention further provides a control program for measuring multiple types of electronic characteristics of a DUT which is a semiconductor device, the control program running on a computer for controlling switching means and multiple measuring means connected to the switching means. The control program is to allow the computer to perform the steps of: causing the computer to control the switching means so that the DUT is electrically disconnected from the second measuring means and is electrically connected to the first measuring means; and causing the computer to control the first measuring means so that a voltage for measuring a first electronic characteristic of the DUT is applied to the DUT via the switching means, to control the second measuring means so that an output voltage of the second measuring means matches an output voltage of the first measuring means, which performs measurement, and to control the second measuring means to maintain a voltage difference between terminals of the switching means small. The control program further is to allow the computer to perform the steps of: causing the computer to control the switching means so that the DUT is electrically disconnected from the first measuring means and is electrically connected to the second measuring means; and causing the computer to control the second measuring means so that a second electronic characteristic of the DUT is measured.

The switching means and the measuring means are controlled by the computer through communication using, for example, a measurement-equipment interface based on the GPIB (general purpose interface bus) standard. Via the computer, the control program can make the switching means and the measuring means operate in conjunction with each other.

The present invention can also be realized by a computer program product that comprises a medium that contains instructions to let a computer to perform the above program.

For measuring characteristics of a DUT, the control method and the control program of the present invention can reduce the time required for switching over from measurement using the first measuring means to measurement using the second measuring means, thus improving the measurement throughput.

DETAILED DESCRIPTION OF PREFERRED EMBODIMENTS

Preferred embodiments according to the present invention will be described below with reference to the accompanying drawings.

First Embodiment

Figure 2:
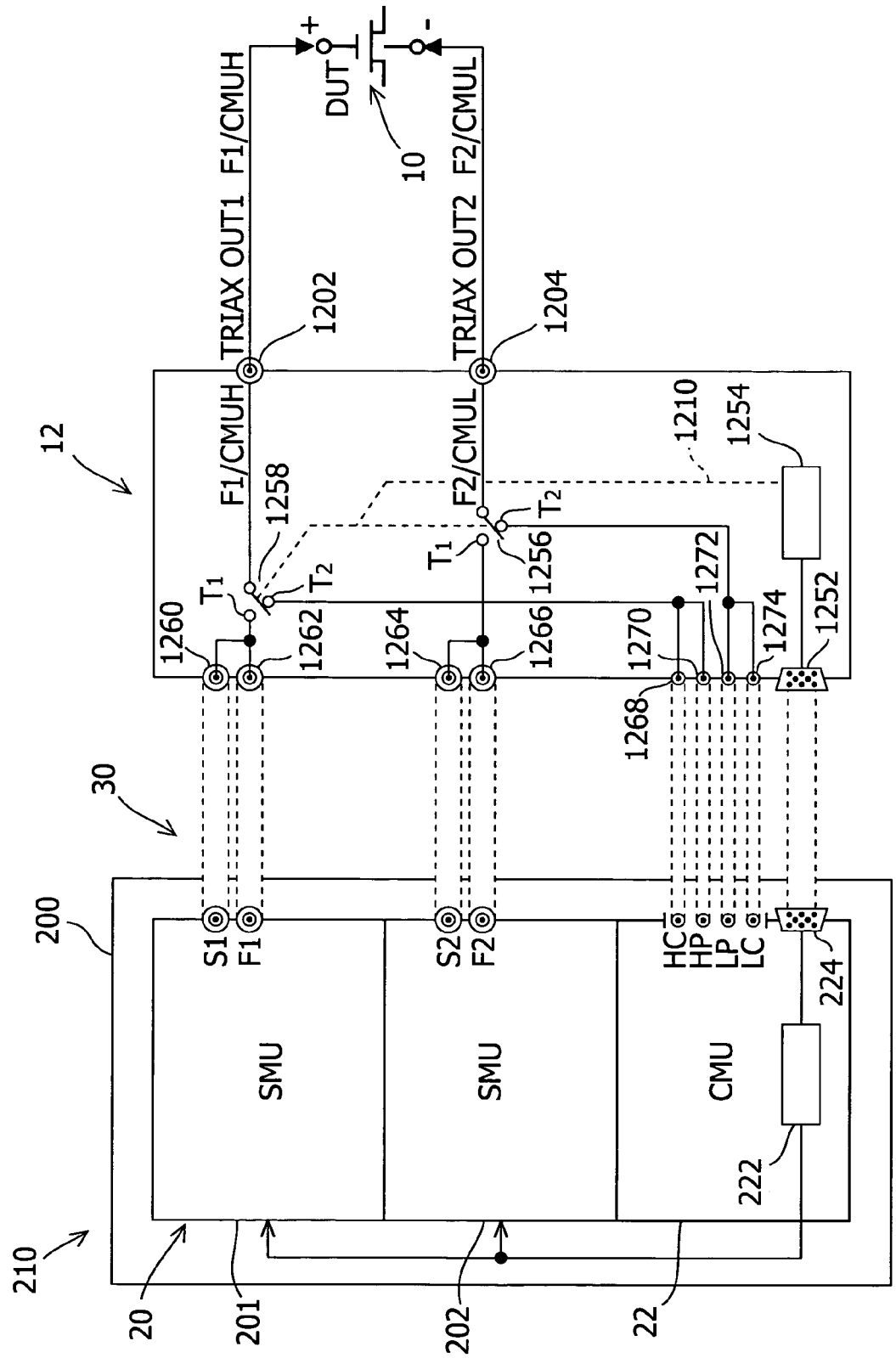
FIG. 2 is a diagram showing the configuration of a connection apparatus in a first embodiment of the present invention.

FIG. 2 is a block diagram showing the configuration of measurement equipment 210, a DUT (device.under test) 10, and an SCUU 12, which are used to implement a control method according to a first embodiment of the preset invention. The SCUU 12 serves as a connection apparatus that connects the measurement equipment 210 and the DUT 10. In this embodiment, switching is performed between electrical-capacitance measurement using a CMU and DC-component of electronic characteristics measurement using an SMU. In FIG. 2, the measurement equipment 210 is mounted in an equipment rack 200. The measurement equipment 210 includes a CMU 22 (first measuring means) and an SMU 20 (including SMUs 201 and 202: second measuring means). Thus, the CMU 22 and the SMU 20 may collectively be referred to as "measurement equipment 210" hereinafter. The measurement equipment 210 uses the measuring means to measure the electronic characteristics of the DUT 10.

The control method according to the first embodiment is directed to a method for controlling switching means (switches) and the measuring means when measurement is performed via, for example, the SCUU 12 shown in FIG. 2. The SMUs 201 and 202 are measuring means in which a DC voltage source, a current source, a voltmeter, and an ammeter are integrated in such a manner that they can be used in an arbitrary combination. The SMUs 201 and 202 can be used to measure, mainly, DC components and to measure a micro current. The SMUs 201 and 202 of the SMU 20 have triaxial-output force terminals F1 and F2 and triaxial-output sense terminals S1 and S2, respectively, so as to allow Kelvin connection. In each triaxial output, a center conductor transmits a signal, an outer shield conductor is connected to common, and a guard signal having a potential maintained at the same potential as the signal in the center conductor is transmitted to a guard conductor disposed between the center conductor and the outer shield conductor.

The CMU 22 can typically measure impedance and can measure L (inductance), C (capacitance), and R (resistance) for various applied waveforms and under various conditions. The CMU 22 can measure high-frequency characteristics, while applying a DC bias. That is, the CMU 22 is measuring means that can serve as inductance measuring means, capacitance measuring means, and resistance measuring means. The CMU 22 includes a controller 222 for controlling switches 1256 and 1258 (switching means) of the SCUU 12. The controller 222 does not necessarily have to be included in the CMU 22. That is, any configuration is applicable so long as the controller 222 is provided in the measurement equipment 210 or so long as the CMU 22 can be controlled by the measurement equipment 210. The controller 222 also transmits corresponding control signals to the SMUs 201 and 202.

The CMU 22 has a coaxial measurement connector HC for outputting positive (high) side current, a coaxial measurement connector HP for measuring a positive-side voltage, a coaxial measurement connector LC for outputting negative (low) side current, and a coaxial measurement connector LP for measuring a negative-side voltage. It should be noted that the shield conductors of the coaxial measurement connectors HC, HP, LC and, LP of the CMU 22 are insulated from the chassis ground of the CMU 22. Herein, for convenience, the expressions "positive (+) side" and "negative (−) side" are used for terminals of the DUT 10 to distinguish between its connections with an apparatus. These expressions, however, are not particularly intended to indicate a high potential and a low potential.

The DUT 10 is, but is not limited to, a semiconductor device, such as a transistor, or a device of a TEG (test element group) or the like fabricated on a silicon wafer and used for determining optimum process conditions for manufacturing integrated circuits. In addition, for example, probes of a probe apparatus (not shown) supply signals to the positive-side and negative-side electrodes of the DUT 10 via connectors 1202 and 1204 provided at the SCUU 12, so that responses from the electrodes are detected.

The connector 1202 is a triaxial output connector used for connection to the positive side of the DUT 10, and the connector 1204 is a triaxial output connector used for connection to the negative side of the DUT 10.

The measurement equipment 210 and the SCUU 12 are connected in the manner indicated by connection 30. This connection 30 can be achieved by directly interconnecting the measurement equipment 210 and the SCUU 12 in the present invention. Alternatively, the connection 30 can be achieved by using a cable assembly or cable assemblies that relay the measurement equipment 210 and the SCUU 12.

The switches 1256 and 1258 are connected to corresponding connectors 1260, 1262, 1264, and 1266, which are adapted to be connected to the respective measurement connectors S1, F1, S2, and F2 of the SMU 20. The switches 1256 and 1258 are also connected to connectors 1268, 1270, 1272, and 1274, which are adapted to be connected to the respective measurement connectors HC, HP, LP, and LC of the CMU 22.

The SCUU 12 has a control-signal connector 1252. Upon receiving a switching signal via the control-signal connector 1252, switch driving means 1254 operates the switches 1256 and 1258. The switches 1258 and 1256 are operated in conjunction with each other. Thus, when the switch 1258 selects a terminal T1, the switch 1256 also selects a terminal T1, and when the switch 1258 selects a terminal T2, the switch 1256 also selects a terminal T2. In this manner, by using the switches 1258 and 1256, the SCUU 12 switches between the SMU 20 and the CMU 22 for measuring the DUT 10. That is, in accordance with the switching signal output from the controller 222, the switches 1256 and 1258 operate so that either the group of connectors 1260 to 1266 or the group of connectors 1268 to 1274 is electrically connected to the DUT 10.

The structure of the switch 1258 of the SCUU 12 will now be described in more detail with reference to FIGS. 3 and 4. The switches 1258 and 1256 have substantially the same structure. In FIG. 2, the connection changed by the switch 1258 is schematically illustrated using the connection for only the center conductors. More specifically, however, as shown in FIGS. 3 and 4, the switch 1258 changes both the connection for the center conductors and the connection for the guard conductors in the case of the connectors 1260 and 1262 connected to the SMU 201 (and both the connection for the center conductors and the connection for the shield conductors in the case of the connectors 1268 and 1270 connected to the CMU 22).

The switch 1258 is constituted by switches 1258A, 1258B, and 1258C. A line L1 is connected to the center conductors of the connectors 1260 and 1262 and is also connected to an upper reed of the switch 1258B. A line G1 is connected to the guard conductors of the connectors 1260 and 1262 and is also connected to an upper reed of the switch 1258A and to an upper reed of the switch 1258C. A line L2 is connected to the center conductors of the connectors 1268 and 1270 and is also connected to a lower reed of the switch 1258A. A line G2 is connected to the shield conductors of the connectors 1268 and 1270 and is also connected to a lower reed of the switch 1258C. A line L3 is connected to the upper and lower reeds of the switch 1258A and is also connected to a lower reed of the switch 1258B. A line L4 is connected to the center conductor of the connector 1202 and is also connected to the upper and lower reeds of the switch 1258B. A line G4 is connected to the guard conductor of the connector 1202 and is also connected to the upper and lower reeds of the switch 1258C. Further, the line G1 is also connected to a guard pipe 1258P of the switch 1258B. The guard pipe 1258P is provided in order to prevent the influences of dielectric absorption, leakage current, and noise at the switch 1258B. Each of the switches 1258A to 1258C exclusively selects one of the upper and lower reeds to establish a connection. The switches 1258A to 1258C are controlled in a coordinated manner by the switch driving means 1254.

Figure 3:
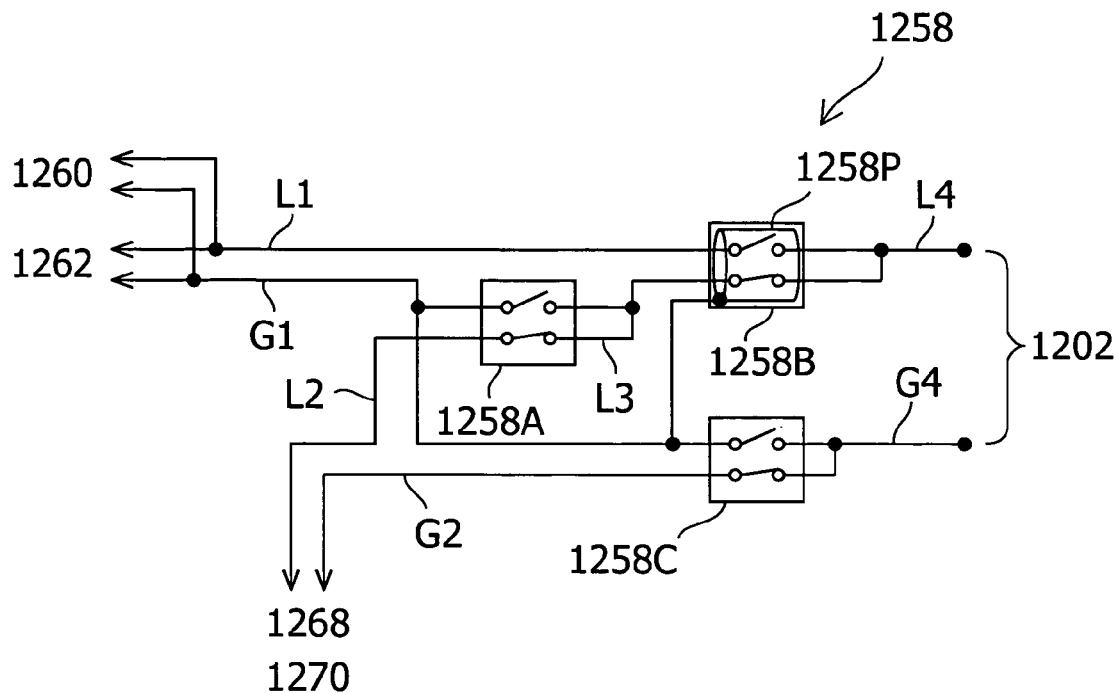
FIG. 3 is a diagram showing one connection state of the connection apparatus in the first embodiment of the present invention.
Figure 4:
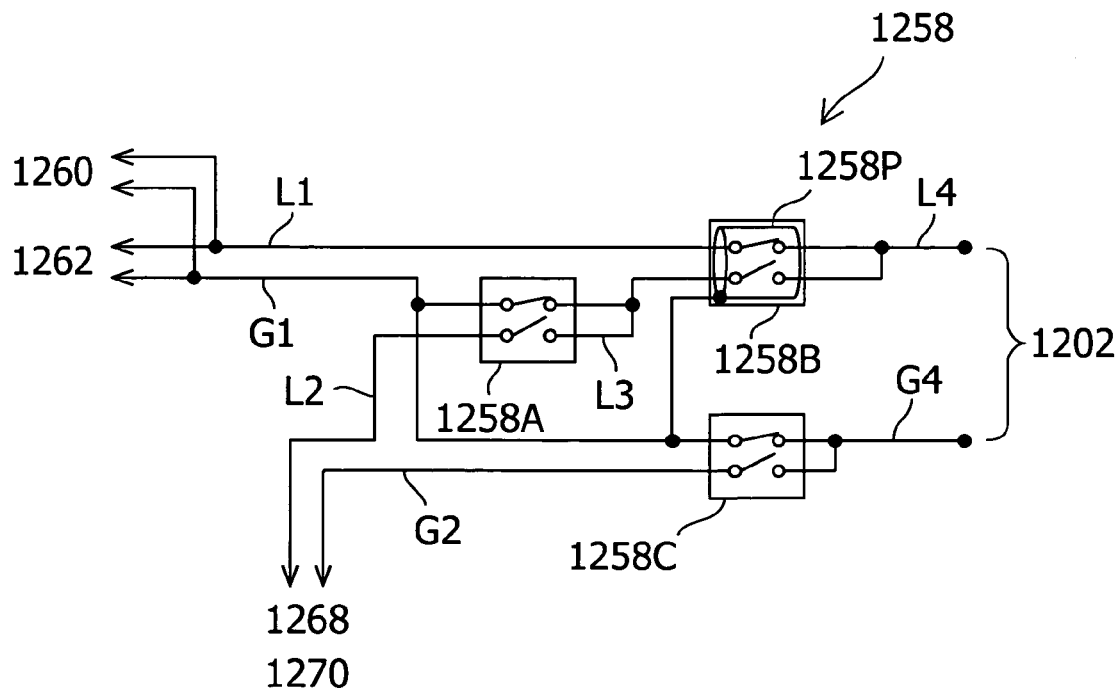
FIG. 4 is a diagram showing another connection state of the connection apparatus in the first embodiment of the present invention.

FIG. 3 shows the states of the switches 1258A to 1258C when the CMU 22 performs measurement, and FIG. 4 shows the states of the switches 1258A to 1258C when the SMU 20 performs measurement. When the CMU 22 performs measurement (FIG. 3), the upper reeds of the switches 1258A to 1258C are disconnected and the lower reeds thereof are connected, and when the SMU 22 performs measurement (FIG. 4), conversely, the upper reeds of the switch 1258A to 1258C are connected and the lower reeds thereof are disconnected.

In this embodiment, the switches 1258A to 1258C are initially put into the states, as shown in FIG. 3, to allow measurement by the CMU 22. While applying a DC bias, the CMU 22 sets a frequency and amplitude to generate an AC measurement voltage and measures the capacitance of the DUT 10 at a predetermined frequency. At this point, the switch 1258C connects the lines G2 and G4. The guard pipe 1258P, which is connected to the line G1, is at the guard potential of the SMU 201, and the line L1 is at the potential of the center conductor of the SMU 201. Thus, the potential between the upper reed of the switch 1258B and the guard pipe 1258P is equal to the potential between the guard conductors connected to the SMU 201 and the center conductors connected to the SMU 201. In an actual circuit for realizing the connections in the circuit diagrams shown in FIGS. 3 and 4, the switch 1258B is implemented with a relay switch, such as a reed switch. In this case, for example, a reed-switch glass tube and a polytetrafluoroethylene (PTFE) supporting portion are interposed between the upper reed of the switch 1258B and the guard pipe 1258P. Dielectric absorption due to the glass tube and the supporting portion is affected by a difference in voltage between the line L4 for the upper reed of the switch 1258B and the guard pipe 1258P. In this embodiment, therefore, the center conductors of. the SMU 201 output a voltage that is substantially the same as the DC bias voltage applied by the CMU 22, to thereby cause the guard conductors of the SMU 201 to output a voltage that is substantially the same as that of the center conductors: This arrangement allows the voltage at a terminal connected to the upper reed of the switch 1258B and the voltage at the guard pipe 1258P to match each other. The CMU 22 then performs measurement in this state. When the DC bias voltage of the CMU 22 is changed, the output voltage of the SMU 201 is changed correspondingly and, consequently, the voltage at the guard pipe 1258P also varies. As a result, the voltage at the guard pipe 1258P is maintained so as to match the voltage of the line L4 for the upper reed of the switch 1258B, and the influence of the dielectric absorption is rarely observed.

Next, the switches 1258A to 1258C are operated to be put into the states, as shown in FIG. 4. In this case, the center conductors of the SMU 201 are connected to the line L4 through the line L1 and the switch 1258B, and the guard conductors of the SMU 201 are connected to the line G4 through the line G1 and the switch 1258C. The line L2 is insulated from the line L3 by the switch 1258A and the line G2 is also insulated from the line G4 by the switch 1258C. The SMU 201 then performs measurement in this state. In this embodiment, the switch 1256, which has substantially the same structure as the switch 1258, performs a similar operation. In cooperation with the SMU 201, the SMU 202 also operates so as to achieve voltage matching at the switch 1256.

Since the SMU 201 outputs the same potential as that of the DC bias components for measurement using the CMU 22, the dielectric absorption at the switch 1258B can be prevented, thus making it possible to reduce the settling time to promptly start high-accuracy measurement using the SMUs 201 and 202.

For measurement using the SMU 20, there is no need to output a DC bias of the CMU 22. This is because, since the CMU 22 performs AC measurement, minute DC components that remain due to dielectric absorption have almost no effect on the measurement.

Although the above description has been given using an example in which the sense terminal of the connector 1260, provided at the SCUU 12 and connected to the SMU 201, is connected to the force terminal of the connector 1262 via the terminal T1, the sense terminal of the connector 1260 can take various connection forms. For example, although not shown, the arrangement may be such that, with the sense terminal of the connector 1260 not being connected to the force terminal 1262, another output connector (not shown) that serves as a sense output terminal for the DUT 10 is provided independently of the connector 1202 and the other output terminal and the sense terminal of the connector 1260 are connected/disconnected by a switch. In such a connection, the sense signal of the SMU is output to the sense output terminal, only when the SMU is used for measurement. In this case, the other connector that serves as the sense output terminal for the DUT 10 employs a triaxial connector, and the guard conductor of the sense output terminal of the SMU is connected to the guard conductor of the connector 1202, which serves as a force output terminal, to provide a guide potential. The center conductor of the sense output terminal is not connected from the CMU.

Second Embodiment

Figure 1:
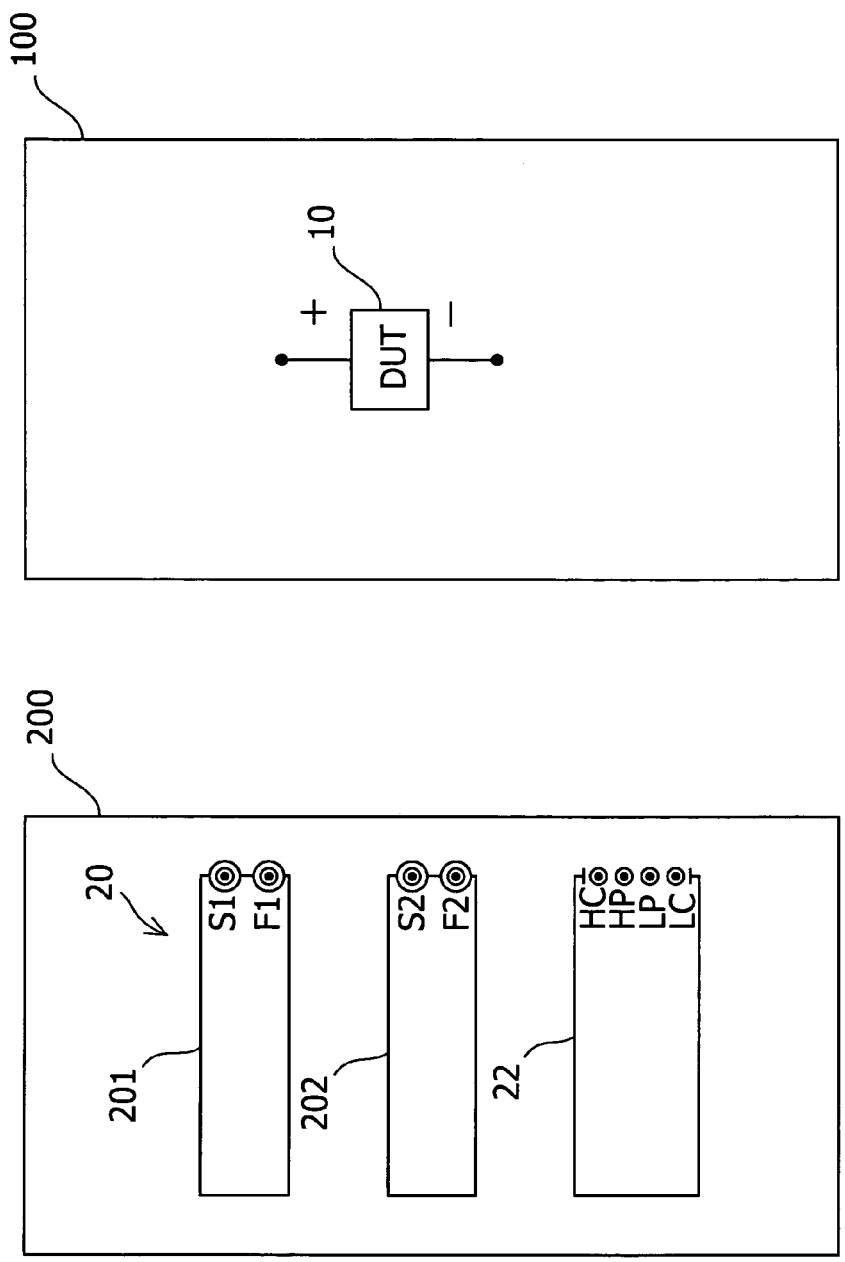
FIG. 1 is a diagram showing the configuration of known semiconductor-device characteristic measurement equipment and a device under test.
Figure 5:
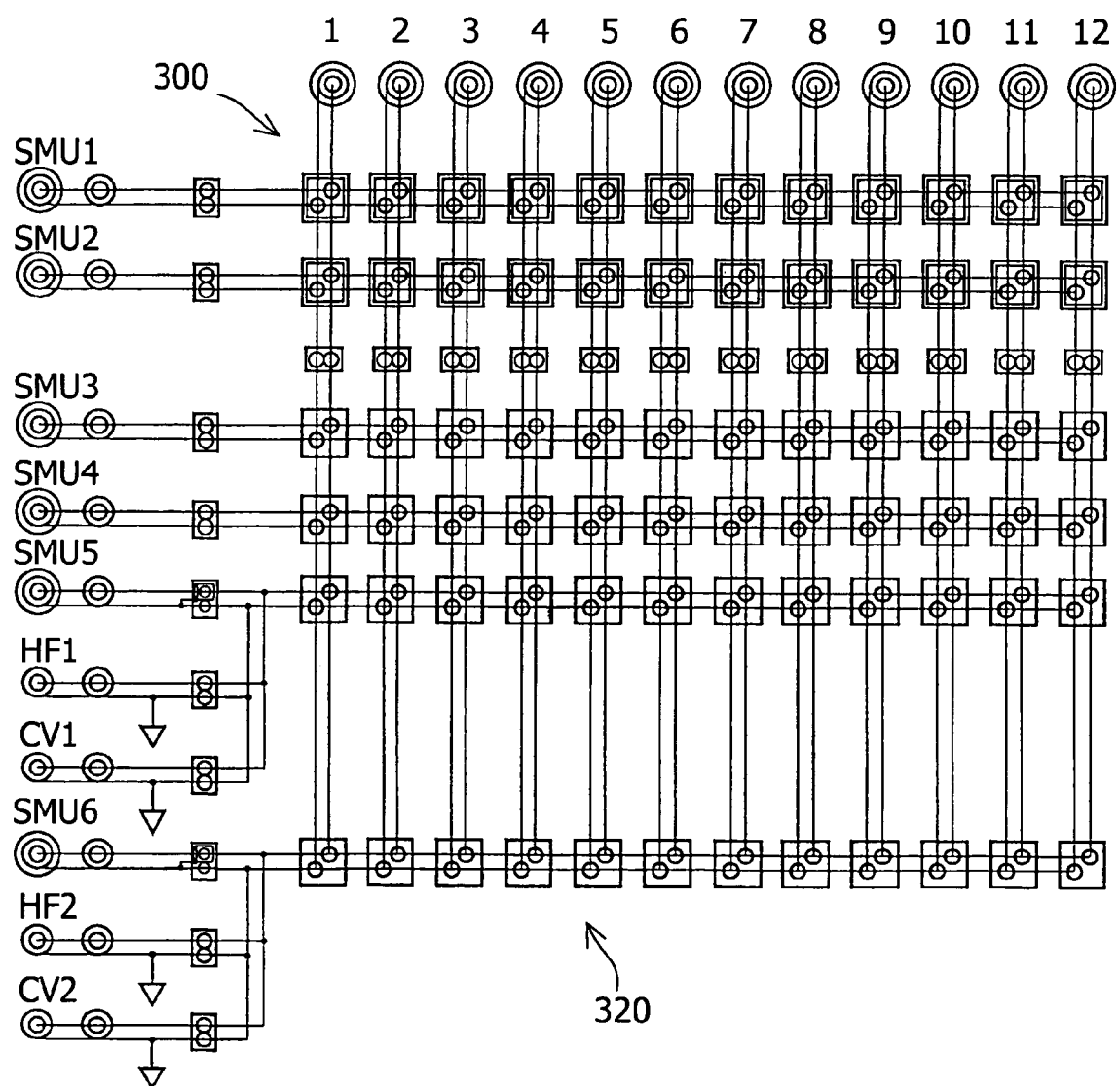
FIG. 5 is a diagram showing the configuration of a connection apparatus in a second embodiment of the present invention.

A second embodiment of the present invention will be described next. In this embodiment, the switching means is provided in a switching matrix rather than in an SCUU. FIG. 5 shows a switching matrix 300 in this embodiment of the present invention. For example, the switching matrix 300 may be implemented by the Agilent E5250 option 001 10×12 Switching Matrix Card together with the Agilent E5250A Switch Mainframe, both of which are manufactured by Agilent Technologies, Inc. Cables are connected from measurement connectors of external SMUs, such as the SMUs 201 and 202, to connectors SMU1 to SMU5, and cables (not shown) are connected from measurement connectors of an external CMU, such as a CMU 22, to connectors HF1, CV1, HF2, and CV2. For example, both of the terminals S1 and F1 of the SMU 201 shown in FIG. 1 may be connected to the terminals of the connector SMU5 and both of the terminals S2 and F2 of the SMU 202 shown in FIG. 1 may be connected to the terminals of the connector SMU6. The terminals of the connector HC, the terminals of the connector HP, the terminals of the connector LP, and the terminals of the connector LC of the CMU 22 may be connected to the terminals of the connector HF1, the terminals of the connector CV1, the terminals of the connector HF2, and the terminals of the connector CV2, respectively. Relay switches 320 in the switching matrix 300 are controlled independently from each other to change a combination of measuring means that changes and uses a combination of the first to twelfth output connectors illustrated at the uppermost row and the connectors SMUU to SMU5, HF1, CV1, SMU6, HF2, and CV2. DUTs, such as semiconductor devices, are connected to the first to twelfth output connectors.

Figure 6:
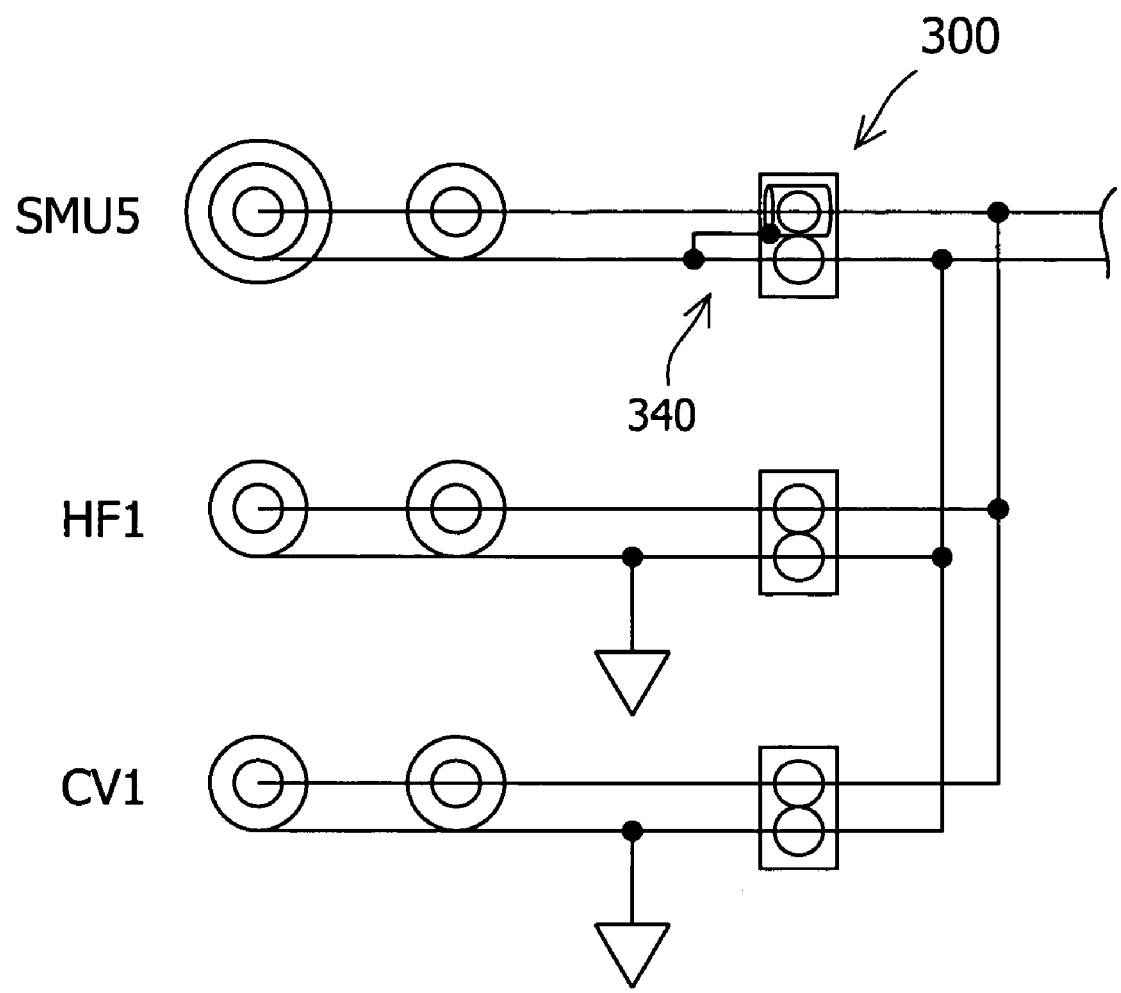
FIG. 6 is a diagram showing the configuration of the connection apparatus in the second embodiment of the present invention.

As illustrated in FIGS. 3 and 4, guard pipes are also provided at the switches, provided for the terminals of the connectors SMU5 and SMU6, so as to surround the center conductor reeds (the upper reeds). Each guard pipe is connected to the guard conductor (disposed between the center conductor and the shield conductor) of the corresponding terminal of the connector SMU5 or SMU6. The connectors SMU5 and SMU6, illustrated by triple circles in FIGS. 5 and 6, represent triaxial connectors, and the connectors HF1, HF2, CV1, and CV2, illustrated by double circles, represent coaxial connectors. The switching matrix 300 can employ either of the connector types, as needed.

FIG. 6 is a partially enlarged view of the connectors SMU5, HF1, and CV1 of the switching matrix 300. With an external SMU being connected to the connector SMU5 and an external CMU being connected to the connectors HF1 and CV1, when the external CMU performs measurement, a difference between a DC bias applied by the external CMU and the potential of the external SMU is applied to a switch 340 (switching means). Thus, in order to prevent the above-mentioned potential difference from causing dielectric absorption at the switch 340, also in this embodiment, when the external CMU is measuring the capacitance of the DUT 10 and the external SMU is insulated from the DUT 10, an output voltage of the external SMU is made to match the DC bias potential of the external CMU and is output. The switch 340 is then operated so as to allow the external SMU to perform measurement.

Even in this case, since the external SMU outputs the same potential as that of the DC bias components during measurement using the external CMU, the dielectric absorption at the switch 340 can be prevented, thus making it possible to reduce the settling time to promptly start high-accuracy measurement using the external SMU.

Third Embodiment

According to a third embodiment of the present invention, the control method can be realized by, for example, a computer program. Specifically, the control program can be implemented by causing a program that runs on a computer to control multiple units of measurement equipment (e.g., SMUs and a CMU) and an SCUU including switching means. In this case, via a communication interface such as a GPIB interface, the computer can control the measurement equipment and the switching means. Since the computer program according to the present invention does not need to take dielectric absorption into account, a waiting time set for program processing associated with settling time can be reduced and thus measurement processing can be performed promptly.

Some illustrative embodiments according to the present invention have been described above in detail. It is apparent to those skilled in the art that various improvements can be made to the embodiments without substantially departing from the novel disclosure and advantages of the present invention. It is, therefore, intended that such improvements are also encompassed by the claims of the present invention.

The entire contents of Japanese patent application No. 2005-208467 is herein incorporated by reference.

We claim:

1. A control method that switches between first and second measuring means connected to switching means in order to measure multiple types of electronic characteristics of a device under test which is a semiconductor device, the control method comprising the steps of:

(a) causing the switching means to electrically disconnect the device under test from the second measuring means and electrically connect the device under test to the first measuring means;
 (b) causing the first measuring means to apply a voltage to the device under test via the switching means for measuring a first electronic characteristic of the device under test and, while causing the first measuring means to apply the voltage to the device under test, maintaining an output voltage of the second measuring means to match an output voltage of the first measuring means;
 (c) causing the switching means to electrically disconnect the device under test from the first measuring means and electrically connect the device under test to the second measuring means; and
 (d) causing the second measuring means to measure a second electronic characteristic of the device under test.

2. The method according to claim 1, wherein the switching means comprises: a first switch that is connected to the device under test to electrically connect or disconnect the device under test with the first measuring means; a second switch that is connected to the device under test to electrically connect or disconnect the device under test with the second measuring means; and a guard pipe that covers a switching portion of the second switch and that is connected to a guard output of the second measuring means.

3. The method according to claim 1, wherein, in step (b), a direct-current component of the output voltage of the first measuring means and a direct-current component of the output voltage of the second measuring means are made substantially equal to each other.

4. The method according to claim 1, wherein the first measuring means comprises an electrical-capacitance measurement device, and the second measuring means comprises a current-voltage characteristic measurement device.

* * * * *